United States Patent
Riccobene et al.

(10) Patent No.: US 6,396,103 B1
(45) Date of Patent: *May 28, 2002

(54) OPTIMIZED SINGLE SIDE POCKET IMPLANT LOCATION FOR A FIELD EFFECT TRANSISTOR

(75) Inventors: Concetta Riccobene, Mountain View; Carl Robert Huster, Sunnyvale, both of CA (US)

(73) Assignee: Advanced Micro Devices, Inc., Sunnyvale, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/243,989

(22) Filed: Feb. 3, 1999

(51) Int. Cl.$^7$ ............................................... A01L 29/78
(52) U.S. Cl. ..................... 257/335; 257/345; 257/402; 438/290; 438/291
(58) Field of Search ................................ 257/335, 345, 257/402; 438/290, 291, FOR 191

(56) References Cited

U.S. PATENT DOCUMENTS

| | | | |
|---|---|---|---|
| 5,244,823 A | * | 9/1993 | Adan |
| 5,753,958 A | * | 5/1998 | Burr et al. |
| 5,759,901 A | * | 6/1998 | Loh et al. |
| 5,899,719 A | * | 5/1999 | Hong |
| 6,020,227 A | * | 2/2000 | Bulucea |

OTHER PUBLICATIONS

Hiroki et al., A High Performance 0.1 μm MOSFET with Asymmetric Channel Profile; International Electron Devices Meeting 1995, pp. 439–442.

S. M. Sze, *Physics of Semiconductor Devices,* Second Edition, published by John Wiley & Sons, pp. 489–490.

Odanaka et al., Potential Design and Transport Property of 0.1 μm MOSFET with Asymmetric Channel Profile; IEEE Transactions on Electron Devices, vol. 44, No. 4, Apr. 1997, pp. 595–600.

Ohzone et al., Influence of Asymmetric/Symmetric source/Drain Region on Asymmetry and Mismatch of CMOSFET's and Circuit Performance; IEEE Transactions on Electron Devices, vol. 45, No. 2, Feb. 1998, pp. 529–537.

* cited by examiner

*Primary Examiner*—Wael Fahmy
*Assistant Examiner*—Joannie A. Garcia
(74) *Attorney, Agent, or Firm*—Eschweiler & Associates, LLC

(57) ABSTRACT

A field effect transistor (300) having a source region (304) and a drain region (306) includes a source side halo region (332) formed at a junction between the source region and a channel region to substantially interrupt off state leakage current. The source side halo region is formed by implanting (408) first doping ions near the surface at the source side of the channel and implanting (410) second doping ions deeper in the channel, near the depth of a source extension (322). In this manner, optimization of leakage current of the field effect transistor is made independent of the drive current of the field effect transistor.

8 Claims, 4 Drawing Sheets

US 6,396,103 B1

OPTIMIZED SINGLE SIDE POCKET IMPLANT LOCATION FOR A FIELD EFFECT TRANSISTOR

FIELD OF THE INVENTION

The present invention relates generally to semiconductor devices. More particularly, the present invention relates to semiconductor devices such as field effect transistors.

BACKGROUND OF THE INVENTION

In a field effect transistor, leakage current is a critical parameter. Leakage current is the drain current, $I_{Doff}$, which flows when the drain is biased normally and the gate to source voltage is set to zero volts. In very large scale integrated circuits employing hundreds of thousands of transistors, the aggregate leakage current can substantially increase overall power dissipation. Hence, there is a need to minimize leakage current for each individual transistor.

In an individual transistor, the leakage current has two components. A first component is surface leakage, which occurs in the channel between the source diffusion and the drain diffusion near the surface of the semiconductor, at the semiconductor-oxide interface. A second component is located deeper in the channel, more distant from the surface, between the source and drain. Control of leakage current requires control of both components.

Previous attempts to control and limit field effect transistor leakage current have involved implantation of doping ions in the channel, under the gate of the transistor, to provide a laterally uniform doped channel. Prior to gate formation, a window is opened in an oxide layer at the location of the channel. Using standard semiconductor processing techniques, an ion implant is made to shift the threshold voltage of the transistor and to limit the leakage current. This ion implantation step results in substantially uniform doping along the length of the channel (from source to drain).

However, this type of leakage current control requires a tradeoff between the leakage current, $I_{Doff}$, and the saturation drain current, $I_{Dsat}$, when the transistor is fully turned on. For best transistor performance (i.e., maximum drain current and switching speed), $I_{Dsat}$ should be maximized. However, the uniform ion implant used to minimize the leakage current tends to reduce $I_{Dsat}$.

Accordingly, there is a need in the art for a method and apparatus providing reduced transistor leakage current without affecting saturation drain current.

SUMMARY OF THE INVENTION

Accordingly, the present invention provides a field effect transistor including a semiconductor substrate, a source region and a drain region formed in the semiconductor substrate, and a gate stack formed on a surface of the semiconductor substrate adjacent to the source region and the drain region. The gate stack defines a channel region in the semiconductor substrate. The field effect transistor further includes a source side halo region formed at a junction between the source region and the channel region to a substantially interrupt off-state leakage current in the field effect transistor.

The invention further provides a method for manufacturing a field effect transistor. The method includes steps of forming a source region and a drain region in a semiconductor substrate, forming a gate stack on a surface of the semiconductor substrate to define a channel region in the semiconductor substrate between the source region and the drain region, and implanting doping ions in the channel region proximate the source to a depth sufficient to substantially interrupt both surface and deep channel leakage current and asymmetrically dope the channel region.

The present invention further provides a method for manufacturing a field effect transistor including steps of forming a source region and a drain region in a semiconductor substrate, forming a gate stack on a surface of the semiconductor substrate and forming a source extension along a gate side of the source region. The source extension has an extension depth less than depth of the source region. The method further includes implanting doping ions at a source side of the channel, including steps of implanting first doping ions at a first angle and a first energy to locate the first doping ions near the surface at the source side of the channel, and implanting second doping ions at a second angle and second energy to locate the second doping ions near the extension depths at the source side of the channel.

DETAILED DESCRIPTION OF THE PRESENTLY PREFERRED EMBODIMENTS

Figure 1:
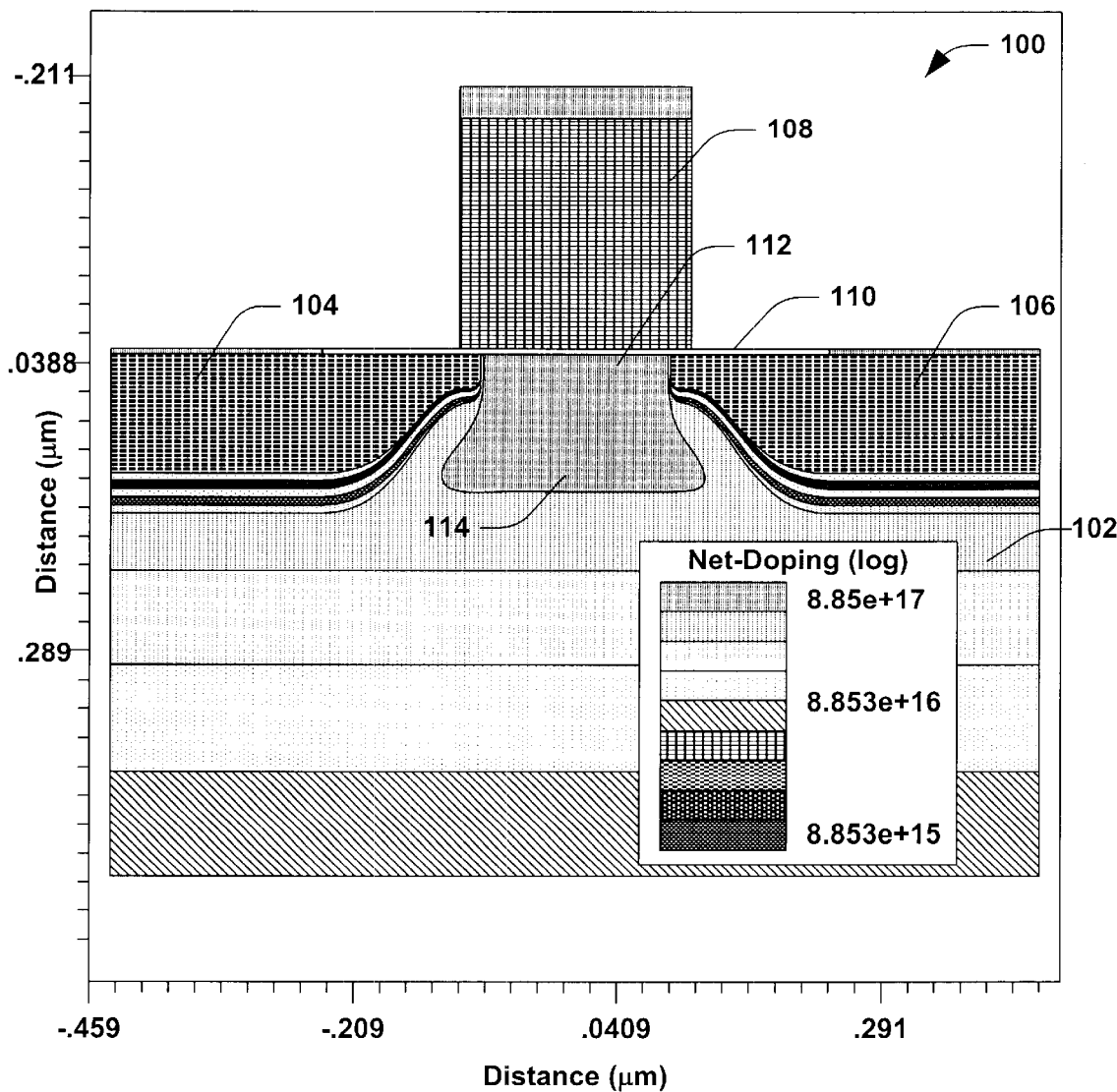
FIG. 1 is a cross-sectional view of a conventional field effect transistor.

Referring now to FIG. 1, it shows a cross-sectional view of a conventional field effect transistor 100. The field effect transistor 100 includes a semiconductor substrate 102, a source region 104 and a drain region 106 formed in the semiconductor substrate 102, and a gate stack 108 formed on a surface 110 of the semiconductor substrate adjacent the source region 104 and the drain region 106. The gate stack 108 defines a channel region 112 in the semiconductor substrate 102.

The semiconductor substrate 102 may be a portion of a semiconductor wafer processed according to conventional semiconductor manufacturing techniques to produce the field effect transistor 100. In another embodiment, the semiconductor substrate 102 may be a portion of an integrated circuit which includes a plurality of field effect transistors.

FIG. 1 shows the absolute value of the log of the net doping concentration for the various regions of the field effect transistor 100. If the semiconductor substrate 102 is of a first doping type, such as n-type, the source region 104 and the drain region 106 are of a complementary doping type, such as p-type. If the source region 104 and the drain region 106 are p-type, then the field effect transistor 100 is a p-channel transistor. Alternatively, if the source region 104 and the drain region 106 are n-type, then the field effect transistor 100 is an n-channel transistor.

To control and limit leakage current in the field effect transistor 100, the transistor includes a channel implant region 114. During manufacture of the field effect transistor 100, doping ions are implanted in the channel region 112 to adjust the threshold voltage of the field effect transistor 100 and to limit the leakage current $I_{Doff}$. This ion implantation step results in substantially uniform doping along the length of the channel, from the source region 104 to the drain region 106. An exemplary value for doping in the channel implant region 114 is $8 \times 10^{17}$ cm$^{-3}$. The doping type of the channel implant region matches the doping type of the semiconductor substrate 102 in the region of the field effect transistor. Thus, a p-channel transistor will have an N-type channel implant region.

However, the highly doped channel implant region 114 is necessary only at the source side of the channel region 112. Extending the highly doped channel implant region 114 across the channel region 112 degrades performance of the field effect transistor 100 when the transistor is operating in the on state. The degradation is in the form of lower drive current provided by the transistor, $I_{Dsat}$. For integrated circuits such as logic and memory devices, it is desirable to maximize $I_{Dsat}$ in order to maximize operating speed and load-driving. This degradation may be reduced by reducing the concentration of the channel implant. However, reducing channel implant concentration tends to increase leakage current, $I_{Doff}$. Accordingly, reduction in leakage current in the conventional transistor, field effect transistor 100 of FIG. 1, requires a concomitant reduction in drive current available from the transistor.

Figure 2:
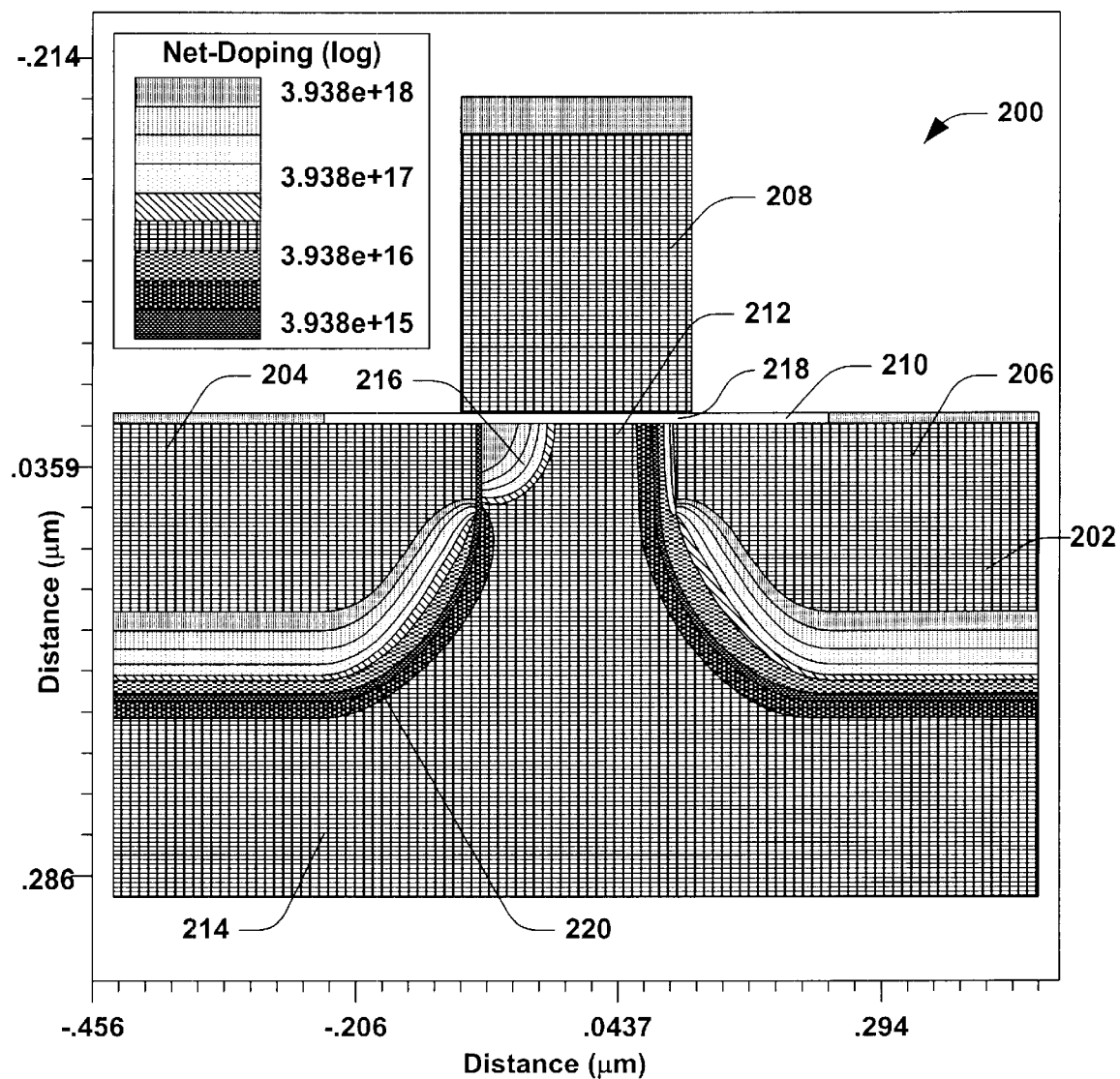
FIG. 2 is a cross-sectional view of a field effect transistor with single pocket implant.

Referring now to FIG. 2, it shows a cross-section of a field effect transistor 200. The field effect transistor 200 includes a semiconductor substrate 202, a source region 204 and a drain region 206 formed in the semiconductor substrate 202 and a gate stack 208 formed on the surface 210 of the semiconductor substrate 202. The gate stack 208 defines a channel region 212 in the semiconductor substrate 202 between the source region 204 and the drain region 206. As in FIG. 1, FIG. 2 shows an absolute value of the log of net doping concentration.

The field effect transistor 200 further includes a source side halo region 216. The source side halo region 216 is located near the surface 210. The surface 210 is defined as the interface between the silicon substrate 202 and the silicon dioxide 218 or other material which forms the insulator between the gate stack 208 and the channel region 212. The source side halo region 216 is obtained by a single ion implant step targeted at the surface 210. This implant will stop any surface leakage, that is, leakage occurring in the channel region 212 near the surface 210. The doping ions used for the source side halo region are of the same type (n-type or p-type) as the channel region 212 and complementary to the doping of the source region 204. An ion implant step is characterized by a tilt angle, and a rotation angle, to be described further below in conjunction with FIG. 3. Ion implantation is also characterized by an implant energy and an implant dose. The source side halo region is also referred to herein as a single or source side pocket implant.

The source side halo region 216 is formed by selecting ion implantation parameters to confine the source side halo region 216 to an area near the source-channel junction and to limit diffusion of the implanted ions so that diffusion is primarily vertical, rather than horizontal. Diffusion in the vertical direction is away from the surface 210, downward in FIG. 2. Diffusion in the horizontal direction is parallel to the surface 210, to the right in FIG. 2. The source channel junction is the metallurgical junction 220 between the source region 204 and the channel region 212 and is marked as a heavy, dark line in FIG. 2. Selection of suitable ion implantation parameters to locate the source side halo region 216 near the source-channel junction is well within the skill of those in the art.

The source side halo region 216 is employed to limit leakage current in the transistor 200 in place of the channel implant region 114 (FIG. 1) used in the conventional transistor 100. By using the source side halo region 216 in the transistor 200, the channel implantation step used to form the channel implant region 114 may be omitted.

The source side halo region 216 is particularly effective at limiting leakage current $I_{Doff}$ near the surface 210 in the channel region 212. Moreover, since no doping ions are implanted near the drain region 206 (unlike the uniformly doped conventional transistor 100 of FIG. 1), the leakage controlling implant does not reduce the drive current $I_{Dsat}$ in the transistor 200.

In some applications, however, sub-surface leakage may be a substantial component of the leakage current, $I_{Doff}$. In such applications, the source side halo region 216 illustrated in FIG. 2 will not be sufficient to control or limit sub-surface leakage. In conventional transistors, such as illustrated in FIG. 1, sub-surface leakage is controlled by a deeper, punch-through implant. The source side halo region 216 may be made to extend deeper vertically into the semiconductor substrate 202, for example, by using a higher implant energy. However, because diffusion of the doping ions will occur both horizontally as well as vertically, the ability to minimize the effect on the drive current $I_{Dsat}$ from the leakage control implant will be reduced. As the implanted doping ions are diffused deeper into the substrate 202, they will also diffuse toward the drain. This is particularly true for deep sub-micron devices, such as those having gate lengths less than 0.15 $\mu$m. Therefore, a single source side halo implant may not be sufficient to form an effective source side pocket.

Figure 3:
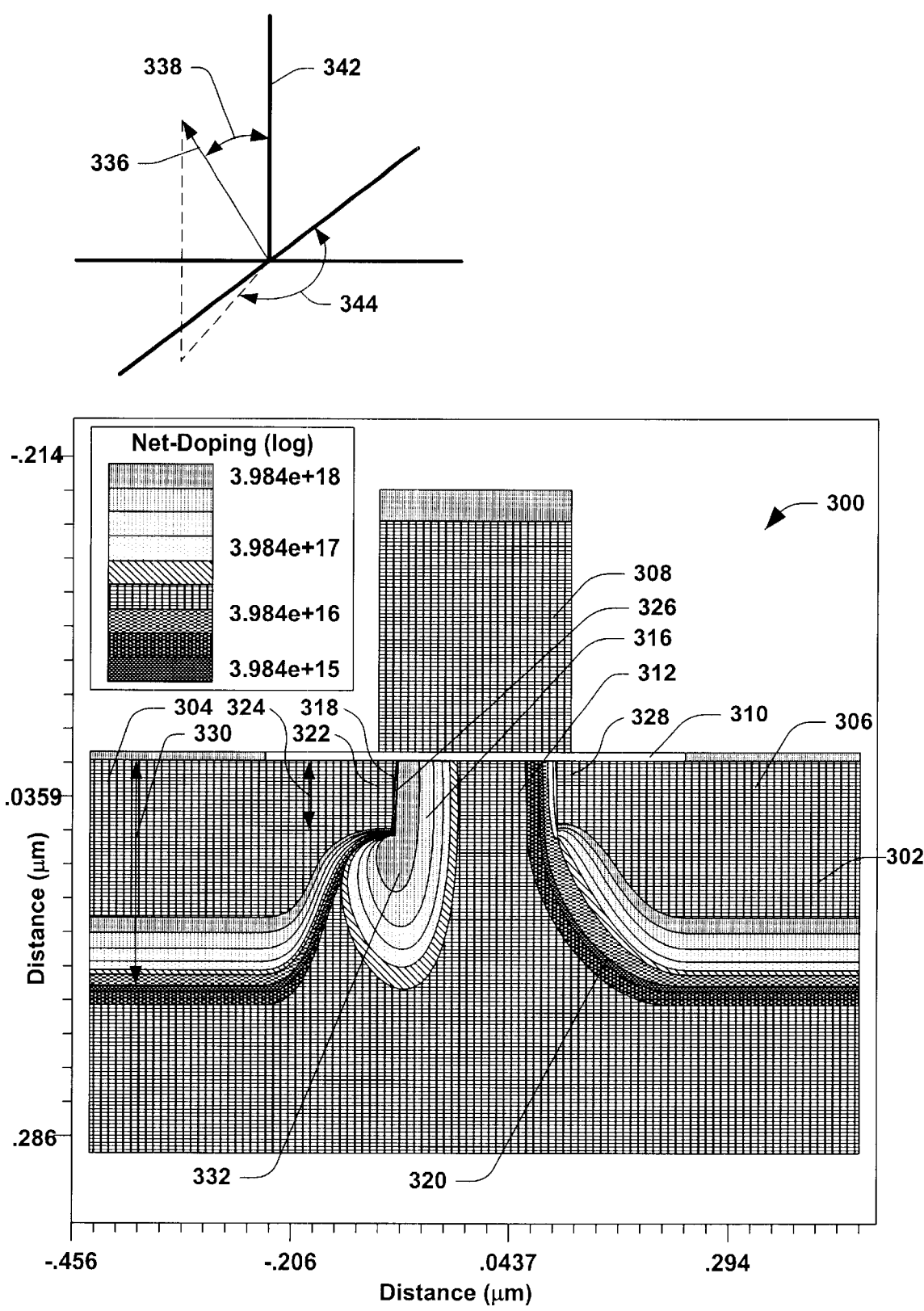
FIG. 3 is a cross-sectional view of a field effect transistor in accordance with the present invention.

Referring now to FIG. 3, it shows a cross-sectional view of a field effect transistor 300 in accordance with the present invention. The field effect transistor 300 includes a semiconductor substrate 302, a source region 304 and a drain region 306 formed in a semiconductor substrate 302, a gate stack 308 formed on a surface 310 of the semiconductor substrate 302. The gate stack 308 defines a channel region 312 in the semiconductor substrate 302 between the source region 304 and the drain region 306. The field effect transistor 300 further includes a single side pocket implant or source side halo region 316 formed at a junction 318 between the source region 304 and the channel region 312. The source side halo region 316 substantially interrupts off-state leakage current in the field effect transistor 300. The junction 318 corresponds to the metallurgical junction between the source region 304 and the semiconductor substrate 302. In FIG. 3, the metallurgical junction 320 between the drain region 306 and the semiconductor substrate is also illustrated.

As can be seen in FIG. 3, the source region 304 includes a source extension 322 adjacent the channel region 312 and extending from the surface 310 to a pre-determined depth 324. The pre-determined depth 324 corresponds to the depth or thickness of the source extension region 322. The source extension region is formed during a LDD or lightly doped drain formation step in the manufacturing of the field effect transistor 300. The drain region 306 has a drain extension 328 comparable to the source extension region 322. The source region 304 has a first depth 330 from the surface and the source extension region 322 has a second depth, the pre-determined depth 324 from the surface 310. The first depth 330 is greater than the second depth 324.

The field effect transistor 300 is manufactured by forming the source region 304 and the drain region 306 in the semiconductor substrate 302, forming the gate stack 308 on the surface 310 of the semiconductor substrate 302 to define the channel region 312 in the semiconductor substrate 302 between the source region 304 and the drain region 306. Further, the method for manufacturing the field effect transistor 300 includes implanting doping ions in the channel region 310 proximate the source region 304 to a depth sufficient to substantially interrupt both surface and deep channel leakage currents and asymmetrically dope the channel region 312. In the illustrated embodiment, doping ions are implanted in the channel region proximate the surface 310 and, further, doping ions are implanted in a sub-surface channel region 332. Preferably, the sub-surface channel region 332 is located at a depth sufficient to interrupt deep channel leakage current arising due to injection of carriers from the source region 304 across the channel region 312 to the drain region 306. In the illustrated embodiment of the FIG. 3, implanting doping ions in the sub-surface channel region 332 requires implanting doping ions near the source extension 322. More particularly, doping ions are implanted in the sub-surface channel region 332 near the source extension 322 at about the second depth, pre-determined depth 324. By implanting ions both near the surface 310 and in the sub-surface channel region .332, the single side pocket or source side halo 316 is made to extend from near the surface 310 all the way down to the sub-surface channel region 332 to substantially interrupt or block leakage current.

As illustrated in FIG. 3, ion implantation occurs along a vector 336 having a tilt angle 338 and a rotation angle 344. The tilt angle is defined as an angle relative to a line 342 drawn normal to the surface 310 of the semiconductor substrate 302. The rotation angle 344 is the angle of rotation about that line 342, which corresponds to the crystal orientation of the semiconductor substrate. Ion implantation is further characterized by an energy, expressed in kiloelectron volts, or kev, and a dose, expressed in atoms per square centimeters. The tilt angle, the rotation angle, the energy and the dose are ion implantation parameters that may be specified for an ion implantation step.

The source side halo region 332 is formed using a first ion implantation step and a second ion implantation step. In the first ion implantation step, first doping ions are implanted at a first angle and a first energy to locate the first doping ions near the surface 310 at the source side of the channel region 312. In the second implantation step, second doping ions are implanted at a second angle and a second energy to locate the second doping ions near the extension depth, which is the pre-determined depth 324 of the source extension 322, at the source side of the channel region 312. The exact energies and angles required may be determined experimentally or by computer simulation. In one exemplary simulation, the first or surface implant included a peak concentration of $2.5 \times 10^{18}$ cm$^{-3}$, a peak position centered at the surface, a horizontal characteristic length of the impurity profile of 0.03 micron, and a vertical characteristic length of the impurity profile 0.03 micron. In this exemplary simulation, the second or subsurface implant include a peak concentration of $4 \times 11^{18}$ cm$^{-3}$, a peak position of 0.059 micron, a horizontal characteristic length of the impurity profile of 0.03 micron and a vertical characteristic length of the impurity profile of 0.04 micron. The parameters are exemplary only and it will be understood that, depending on material and equipment variations and other factors, other parameters may be suitable.

Figure 4:
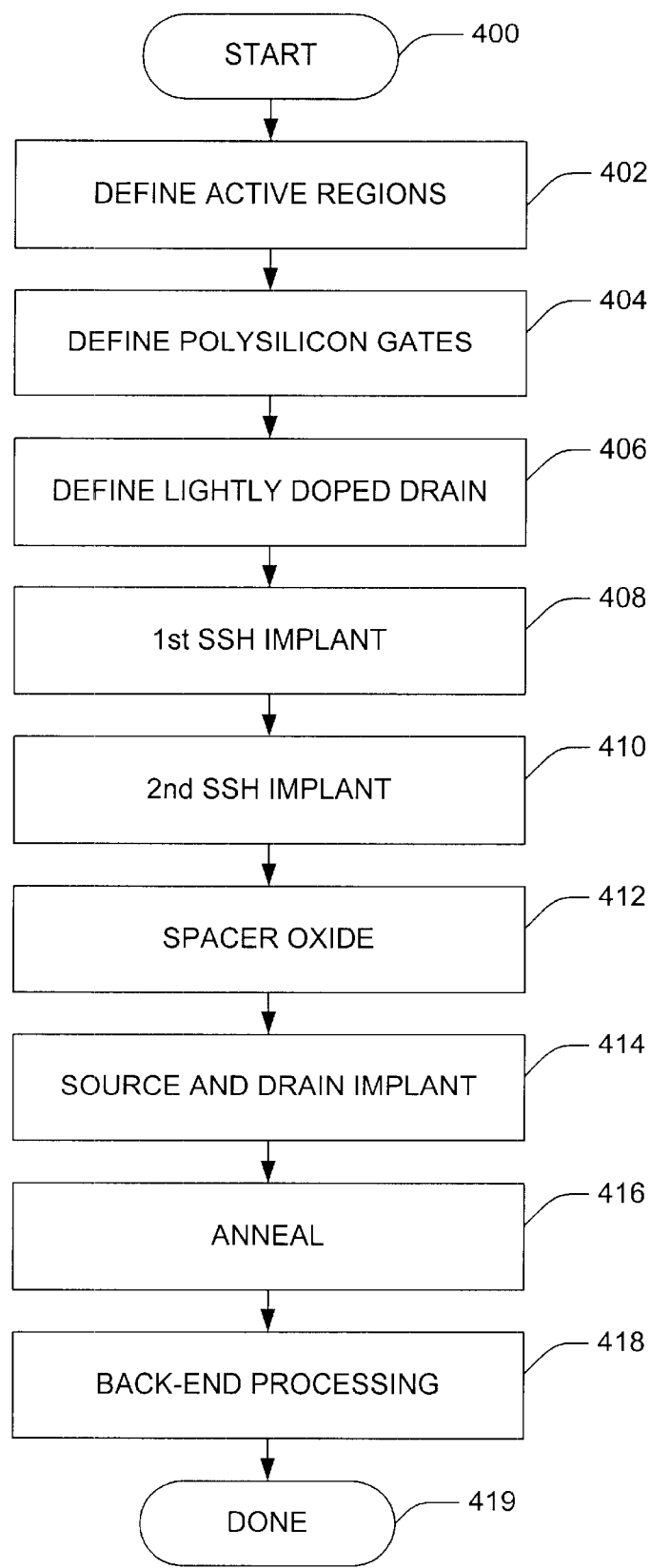
FIG. 4 is a flow diagram illustrating a method for manufacturing a field effect transistor in accordance with the present invention.

Referring now to FIG. 4, it shows a flow diagram illustrating a method for manufacturing a field effect transistor in accordance with the present invention. The method begins at step 400. At step 402, active regions are defined in the surface of a semiconductor substrate. To accomplish this, a field oxide layer is formed on the surface of the semiconductor substrate and regions where field effect transistors will ultimately be formed are patterned on the field oxide using conventional photolithographic techniques. The patterned oxide regions are removed to expose the silicon below. The method continues at step 404, where polysilicon gates are defined. A layer of polysilicon is deposited on the surface of the semiconductor substrate including on field oxide regions and the exposed active region. The polysilicon is patterned and excess polysilicon is removed, leaving only polysilicon gates and interconnections.

The method continues at step 406. At this step, the lightly doped drain region is defined. The lightly doped drain or LLD regions form the source extension and drain extension regions illustrated in FIG. 3. Typically, the lightly doped drain regions have a shallower depth and lighter doping than the source region and drain region from which they extend.

The method continues at step 408. During this step, the first source side halo implant occurs. The implant is made at a first energy and a first tilt angle to locate doping ions near the surface at the source side of the channel. In the illustrated embodiment of FIG. 4, at step 410, the second source side halo implant occurs, this time using a second energy and second tilt angle to locate doping ions near the extension depth at the source side of the channel. The extension depth generally corresponds to the depth of the lightly doped drain region or source extension region. However, other implant depths may be selected in order to substantially interrupt off-state, deep channel leakage current in the channel region. Because the second source side halo implant is implanting doping ions at a deeper depth than the first source side halo implant, generally the energy for the second source side halo implant will be greater than the energy for the first source side halo implant. Also, because of the different depths, the tilt angle required for the first source side halo implant will likely be shallower than the angle for the second source side halo implant. The two source side halo implants together form the single side pocket implant located at the source side of the channel. Because the source side halo region is formed in the channel, the channel implant step required to form the convention transistor (FIG. 1) is omitted from the method of FIG. 4.

The method continues at step 412, where oxide spacer is formed and defined on the sides of the polysilicon gates. Spacers are used to space out the source and drain implant from the channel. They are implanted at higher energy and a higher dose, so, if not placed further apart from the polysilicon gate when diffused, they would completely cover the LDD region or even the channel region. At step 414, the source and drain implant occurs. This is a relatively high concentration energy implant to form the heavily doped and deep source and drain regions. At step 416, an anneal step occurs to heal any damage which may have occurred in the crystal lattice of the semiconductor substrate following implantation and to activate the implants.

At step 418, back-end processing occurs. Back-end processing includes formation of contacts to doped source and drain regions and polysilicon regions, metallization and final processing of the semiconductor substrate. These steps are well-known to those ordinarily skilled in the art of semiconductor processing and manufacturing. The method in accordance with the present invention may include other steps necessary to reduce manufacturing costs or improve performance of field effect transistors or other devices formed in the semiconductor substrate. The method steps of FIG. 4 are illustrative of the present invention only.

From the foregoing, it can be seen that the present invention provides a field effect transistor and a method for manufacturing field effect transistors. A source side halo region is defined along the source side of the channel underneath the gate of the field effect transistor. The source side halo region controls and limits current flow in the transistor when the transistor is in the off state. The source side halo region may be formed using a single implant. Preferably, the source side halo region is formed using two implants, a first implant targeted at or near the surface of the semiconductor region and a second implant targeted more deeply in the channel. The implants are confined along the source-channel junction, with lateral diffusion minimized in favor of vertical diffusion. In this manner, leakage current is minimized without the need for performance tradeoffs between leakage current and drive current provided by the field effect transistor. The dry current, $I_{Dsat}$ can be separately and independently optimized.

While a particular embodiment of the present invention has been shown and described, modifications may be made. It is therefore intended in the appended claims and equivalents to cover all such changes and modifications which fall within the true spirit and scope of the invention.

We claim:

1. A field effect transistor comprising:

a semiconductor substrate;

a source region and a drain region formed in the semiconductor substrate;

a gate stack formed on a surface of the semiconductor substrate adjacent the source region and the drain region and defining a channel region in the semiconductor substrate; and a source side halo region formed at a junction between the source region and the channel region, said source side halo region having a first sub-surface doping ion implant region proximate the surface of the semiconductor substrate, the first sub-surface doping implant region having a peak dopant concentration of about $2.5\times10^{18}/cm^3$, and a second sub-surface doping implant region extending from the first sub-surface doping implant region and away from the drain region, the second sub-surface doping implant region having a peak dopant concentration of about $4\times10^{18}/cm^3$ or more, and located to substantially interrupt off-state leakage current in the field effect transistor.

2. A field effect transistor as defined in claim 1 wherein the source region includes a source extension adjacent the channel region extending from the surface to a predetermined depth and wherein the source side halo region is located along a channel edge of the source region and extending from the surface to at least the predetermined depth.

3. A field effect transistor as defined in claim 2 wherein the source side halo region extends from the surface of the semiconductor substrate along a gate edge of the source extension.

4. A field effect transistor as defined in claim 1 wherein the semiconductor substrate is of a first doping type and the source region and the drain region are of a complementary doping type and wherein the source side halo region is of the first doping type.

5. A field effect transistor as defined in claim 4 wherein the doping level of the source side halo region is substantially higher than the doping level of the channel region of the semiconductor substrate.

6. An integrated circuit comprising:

a semiconductor substrate; and a plurality of field effect transistors formed in the semiconductor substrate, at least one field effect transistor including a source region and a drain region formed in the semiconductor substrate and separated by a channel, and a sub-surface channel region located adjacent to the source region, said sub-surface channel region having a first sub-surface doping ion implant region proximate the surface of the semiconductor substrate, the first sub-surface doping implant region having a peak dopant concentration of about $2.5\times10^{18}/cm^3$, and a second sub-surface doping implant region extending from the first sub-surface doping implant region and away from the drain region in the channel and extending from near a surface of the semiconductor substrate to a depth sufficient to substantially interrupt both surface and deep channel leakage current and asymmetrically dope the channel, wherein the second sub-surface doping implant region has a peak dopant concentration of about $4\times10^{18}/cm^3$ or more.

7. A field effect transistor comprising:

a semiconductor substrate;

a source region and a drain region formed in the semiconductor substrate;

a gate stack formed on a surface of the semiconductor substrate adjacent the source region and the drain region and defining a channel region in the semiconductor substrate; and a source side halo region formed at a junction between the source region and the channel region, said source side halo region having a first sub-surface doping ion implant region proximate the surface of the semiconductor substrate, the first sub-surface doping implant region having a first dopant concentration, and a second sub-surface doping implant region extending from the first sub-surface doping implant region and away from the drain region, the second sub-surface doping implant region having a second dopant concentration which is greater than the first dopant concentration, and located to substantially interrupt off-state leakage current in the field effect transistor.

8. An integrated circuit comprising:

a semiconductor substrate; and a plurality of field effect transistors formed in the semiconductor substrate, at least one field effect transistor including a source region and a drain region formed in the semiconductor substrate and separated by a channel, and a sub-surface channel region located adjacent to the source region, said sub-surface channel region having a first sub-surface doping ion implant region proximate the surface of the semiconductor substrate, the first sub-surface doping implant region having a first dopant concentration, and a second sub-surface doping implant region extending from the first sub-surface doping implant region and away from the drain region in the channel and extending from near a surface of the semiconductor substrate to a depth sufficient to substantially interrupt both surface and deep channel leakage current and asymmetrically dope the channel, wherein the second sub-surface doping implant region has a second dopant concentration which is greater than the first dopant concentration.

* * * * *

UNITED STATES PATENT AND TRADEMARK OFFICE
CERTIFICATE OF CORRECTION

PATENT NO.     : 6,396,103 B1
DATED          : May 28, 2002
INVENTOR(S)    : Concetta Riccobene and Carl Robert Huster It is certified that error appears in the above-identified patent and that said Letters Patent is hereby corrected as shown below:

<u>Column 5,</u>
Line 56, please replace the formula "$4 \text{x} 11^{18}$" with the formula -- $4 \text{x} 10^{18}$ --.

Signed and Sealed this

First Day of October, 2002

*Attest:*

*Attesting Officer*

JAMES E. ROGAN
*Director of the United States Patent and Trademark Office*